(12) United States Patent
Aritome (10) Patent No.: US 7,483,311 B2
(45) Date of Patent: Jan. 27, 2009

(54) ERASE OPERATION IN A FLASH MEMORY DEVICE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 241 days.

(21) Appl. No.: 11/348,678

(22) Filed: Feb. 7, 2006

(65) Prior Publication Data

US 2007/0183220 A1     Aug. 9, 2007

(51) Int. Cl.
    *G11C 16/04*     (2006.01)
(52) U.S. Cl. .................... 365/185.3; 365/185.17; 365/185.05; 365/185.18; 365/185.19
(58) Field of Classification Search ........... 365/185.3, 365/185.17, 185.02, 185.18, 185.22, 185.19
    See application file for complete search history.

(56) References Cited

U.S. PATENT DOCUMENTS

| | | | |
|---|---|---|---|
| 5,995,418 A * | 11/1999 | Chen et al. | 365/185.29 |
| 6,438,037 B1 * | 8/2002 | Fastow et al. | 365/185.22 |
| 6,795,348 B2 | 9/2004 | Mihnea et al. | |
| 6,856,553 B2 | 2/2005 | Tomita et al. | |
| 6,870,765 B2 | 3/2005 | Fujiwara | |
| 6,885,053 B1 | 4/2005 | Tsujioka | |
| 6,914,827 B2 | 7/2005 | Choi | |
| 6,930,928 B2 | 8/2005 | Liu et al. | |
| 6,947,331 B1 | 9/2005 | Mirgorodski et al. | |
| 6,958,934 B2 | 10/2005 | Fan et al. | |
| 6,973,530 B2 | 12/2005 | Hurich | |
| 7,009,889 B2 | 3/2006 | Tran et al. | |
| 7,020,024 B2 | 3/2006 | Sim | |
| 7,274,596 B2 * | 9/2007 | Roohparvar | 365/185.17 |
| 7,411,833 B2 * | 8/2008 | Chu et al. | 365/185.22 |
| 2005/0286313 A1 | 12/2005 | Mihnea | |
| 2005/0286314 A1 | 12/2005 | Mihnea | |
| 2005/0286315 A1 | 12/2005 | Mihnea | |
| 2006/0050594 A1 | 3/2006 | Park | |
| 2006/0053247 A1 | 3/2006 | Cheung | |
| 2007/0189070 A1 * | 8/2007 | Tanaka et al. | 365/185.3 |

* cited by examiner

*Primary Examiner*—Connie C Yoha
(74) *Attorney, Agent, or Firm*—Leffert Jay & Polglaze P.A.

(57) ABSTRACT

A method for erasing a non-volatile memory device performs a block erase operation. The cells are then soft programmed and erase verified to determine if the threshold voltages indicate erased cells. A target cell is programmed to a first threshold voltage and verified. Adjacent cells are programmed and verified. The parasitic capacitance between the target cells and the adjacent cells causes the threshold voltage of the target cell to increase to a new threshold voltage with the programming of the adjacent cells. A difference between the new threshold voltage and the first threshold voltage is determined. If the difference is greater than or equal to a predetermined threshold, the target cell is soft programmed until the difference is less than the predetermined threshold.

22 Claims, 8 Drawing Sheets

ERASE OPERATION IN A FLASH MEMORY DEVICE

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NOR" and "NAND" architectures. The architecture names refer to the resemblance that the memory cell configuration of each architecture has to a basic NOR or NAND gate circuit, respectively.

In the NOR array architecture, the floating gate memory cells of the memory array are arranged in a matrix. The gates of each floating gate memory cell of the array matrix are connected by rows to word select lines (word lines) and their drains are connected to column bit lines. The source of each floating gate memory cell is typically connected to a common source line.

A NAND array architecture also arranges its array of floating gate memory cells in a matrix such that the gates of each floating gate memory cell of the array are connected by rows to word lines. Each memory cell, however, is not directly connected to a source line and a column bit line. The memory cells of the array are instead arranged together in strings. Each string typically comprises 8, 16, 32, or more cells. The memory cells in the string are connected together in series, source to drain, between a common sourceline and a column bitline.

As the performance of electronic systems increase, the performance of flash memory devices in the systems should increase as well. A performance increase can include improving both the speed and the memory density of the devices. One way to accomplish both of these criteria is to reduce the memory device size.

One problem with decreasing the size of a NAND flash memory device is the floating gate-to-floating gate coupling that occurs as the memory cells get closer together. For example, one cell's threshold voltage can be increased by increasing the threshold voltage of adjacent cells. The increased capacitive coupling between the floating gates can affect the verification, reading, and erasing of adjacent cells.

For the reasons stated above, and for other reasons stated below which will become apparent to those skilled in the art upon reading and understanding the present specification, there is a need in the art for a way to reduce the effect of capacitive coupling between adjacent floating gates on memory operations.

SUMMARY

The above-mentioned problems with floating gate capacitive coupling and other problems are addressed by the present invention and will be understood by reading and studying the following specification.

The embodiments of the present invention encompass a method for erasing a non-volatile memory device. The memory device has a plurality of cells organized in rows and columns. The method comprises programming a first cell of the plurality of cells to a first threshold voltage. The first cell is located in a first row and a first column. At least one adjacent cell is programmed. A second threshold voltage for the first cell is measured. A threshold voltage difference is determined in response to the first and second threshold voltages. If the threshold voltage difference is greater than or equal to a predetermined threshold, a soft programming operation is performed on the first cell until the threshold voltage difference is less than the predetermined threshold.

Further embodiments of the invention include methods and apparatus of varying scope.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
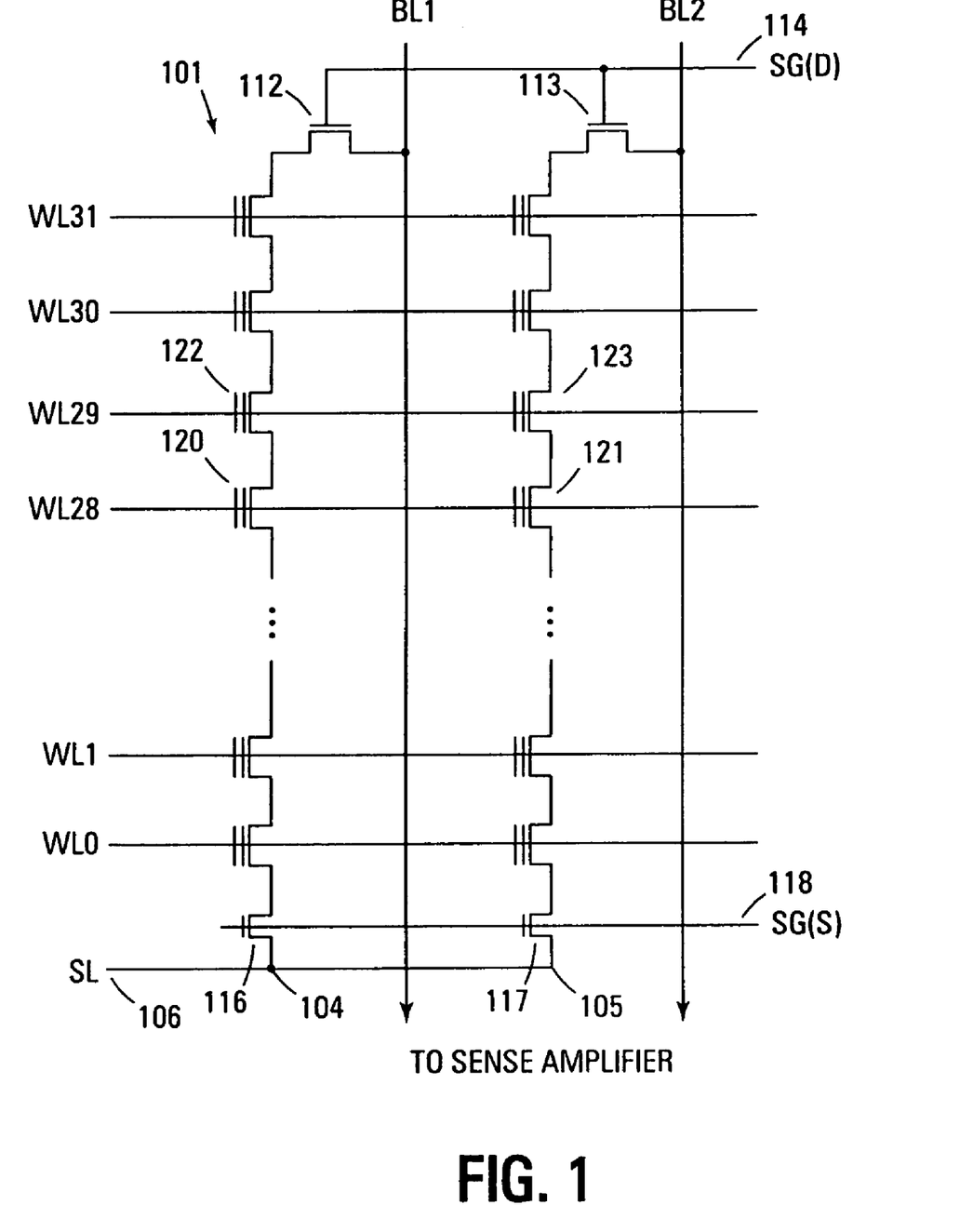
FIG. 1 shows a simplified diagram of one embodiment of a NAND flash memory array architecture.

FIG. 1 illustrates a simplified diagram of one embodiment for a NAND flash memory array of the present invention. The memory array of FIG. 1, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

Each cell can be programmed as a single bit per cell (i.e., single level cell—SLC) or multiple bits per cell (i.e., multi-level cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical programming operation, a selected word line for the flash memory cell to be programmed is biased with a series of programming pulses that start at a predetermined voltage (e.g., 16V) and increase by a predetermined incremental voltage until the cell is programmed. A verification operation with a word line voltage of 0V is then performed to determine if the floating gate has been programmed. The unselected word lines for the remaining cells are typically biased at approximately 10V during the program operation.

This programming method is for purposes of illustration only. The voltages and steps discussed may be different for different embodiments.

FIG. 1 illustrates four adjacent memory cells 120-123 of the array. The capacitive coupling of adjacent cells can occur along the same bit line or along the same word line. For example, the floating gates of cells 120, 122 or 121, 123 along bit line 104 or 105, respectively can interact. Additionally, cells 120, 121 or 122, 123 along word lines WL28 or WL29, respectively, can also be capacitively coupled.

Figure 2:
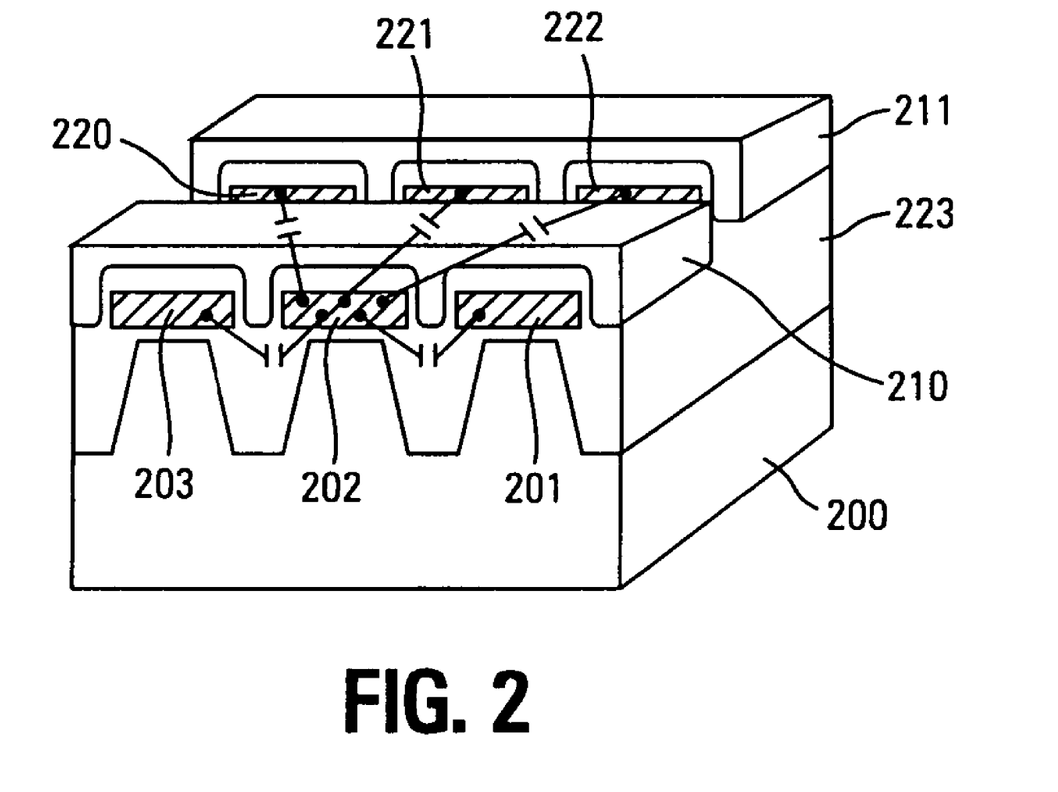
FIG. 2 shows a cross-sectional view of a memory array with floating gate capacitive coupling.

FIG. 2 illustrates the capacitive coupling in a cross-sectional view of one embodiment of the memory array of FIG. 1. This view shows the floating gate cells fabricated on a substrate 200. Each cell is comprised of a floating gate 201-203 formed over the substrate 200. A control gate 210, 211 is formed over the floating gates. Each control gate 210, 211 is coupled to a word line. Shallow trench isolation (STI) 212 is formed between the cells and the substrate 200.

For purposes of illustration, the center cell 202 is considered to be the target cell as discussed subsequently. This cell 202 is capacitively coupled to the adjacent cells 201, 203 along the same word line 210 as well as the adjacent cells 220-222 coupled to the adjacent word lines 211.

In one embodiment, programming the target cell 202 increases the threshold voltage ($V_t$) of the cell to 0.5V. After the adjacent cells 201, 203, 220-222 are programmed, the capacitive coupling increases the threshold voltage of the target cell 202. This may cause problems during memory operations. For example, an erase operation may assume that the cell has a programmed $V_t$ of 1.0V and attempt to erase the cell based on this voltage. However, since the actual $V_t$ is larger than the assumed voltage, the erase will probably require additional erase pulses than initially planned.

Figure 3:
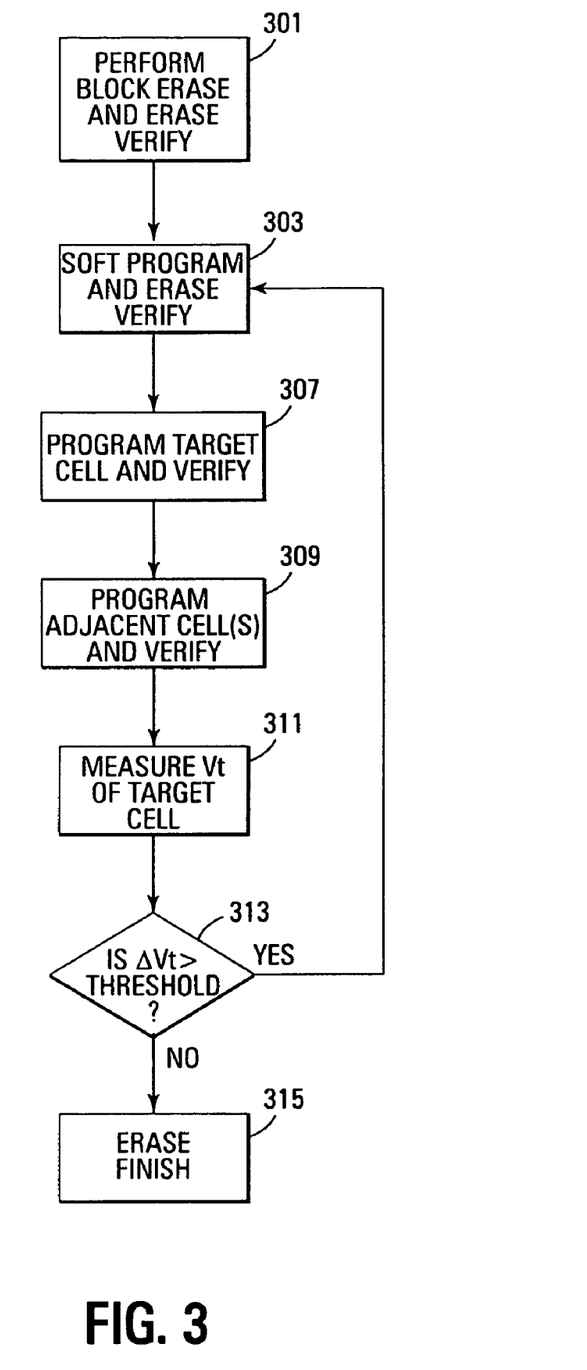
FIG. 3 shows a flow chart of one embodiment of a method for erasing a non-volatile memory device.

FIG. 3 illustrates a flowchart of one embodiment of a method of the present invention for erasing a memory array taking into account capacitive coupling of adjacent floating gates. The method begins with a block erase operation that includes an erase verify 301. Since flash memory devices are typically erased a block at a time, in one embodiment the entire block containing the memory cell or cells to be programmed is erased by applying a predetermined negative voltage on the word lines of the rows to be erased. This forces the floating gates of the block to lose their charge and erases the block. In one embodiment, the erased cells have a $V_t$ of −4.0V. Alternate embodiments use other voltages.

The block is then soft programmed 303. A soft programming pulse is generated to bias the word line of the cell to be programmed in order to raise its $V_t$ from the −4.0V erased voltage to −3.0V. The soft programming may be accomplished by a shorter than normal programming pulse and/or programming pulse having a lower voltage. The cells of the block are still erased but the soft programming operation starts all of the cells of the block at a substantially uniform erased threshold voltage since the erase operation may over-erase some of the cells.

An erase verification operation 303 is performed on the erase block to verify that the cells are at the proper erase $V_t$. Any cells that are not at the proper $V_t$ are biased with another soft programming pulse until the cells in the erase block have substantially uniform threshold voltages.

In one embodiment, the verification operation biases the selected word lines with 1.0V during verification and the unselected wordlines are biased at 4.5V. Alternate embodiments may use other voltage levels for both the selected and unselected wordlines.

In one embodiment, the erase verification operation of the present invention can be performed with a lock-out function. The lock-out function prohibits the reading of memory cells that have been locked from access by lock bits. In one embodiment, the lock bits are stored by the memory device controller into status/control registers on the chip. These cells can be locked by the manufacturer or by the end user to protect important information.

The target memory cell is then programmed and verified 307. The target cell is programmed and verified to a predetermined threshold voltage, $V_{t1}$. The programming may be a single cell as the result of a bit programming. In another embodiment, a byte or more of data can be programmed such that the target cell as well as other cells of a page are programmed.

In one embodiment, the programming operation is comprised of generating a plurality of programming pulses that start at a predetermined voltage (e.g., 16V) and incremented by a predetermined voltage for each pulse until the cell is verified as programmed at $V_{t1}$.

The adjacent cells to the target cell are then programmed and verified 309. This operation may program each of the cells that are adjacent to the target cell such as in both the adjacent word lines and the adjacent bit lines. In an alternate embodiment, only one of the adjacent cells is programmed and verified. As described previously, this operation changes the $V_t$ of the target cell by $\Delta V_t$.

The size of $\Delta V_t$ is determined by the amount of parasitic capacitance in the array. The array structure, fabrication materials, and fabrication techniques determines the amount of parasitic capacitance.

The $V_t$ of the target cell is then measured 311. The measurement operation, in one embodiment, is accomplished by selecting the cell and the sense amplifier measuring the resulting voltage. For purposes of illustration, the new $V_t$ is referred to as $V_{t2}$.

The erase threshold voltage (i.e., $\Delta V_t$) is determined by subtracting the original $V_{t1}$ from $V_{t2}$ (i.e., $V_{t2}-V_t=\Delta V_t$). If $\Delta V_t$ is greater than or equal to a predetermined threshold 313, the Erase $V_t$ is too low and another soft programming operation 303 is required in order to raise the $V_t$ of the target cell.

In one embodiment, the predetermined threshold is 50 mV. This threshold is determined by the chip manufacturer by empirical testing of a large number of memory devices to determine what voltage level cut-off provides the best point at which additional soft programming pulses are required. The embodiments of the present invention, however, are not limited to only the threshold voltage of 50 mV. Alternate embodiments may use other predetermined threshold voltages.

Having an Erase $V_t$ that is too low can cause problems later when it desired to program the cell. The other cells in the erase block that have higher Erase $V_t$'s would require fewer program pulses to be programmed. Thus the cells with the Erase $V_t$'s that are too low might not be programmed since the programming operation may stop programming after a predetermined maximum quantity of programming pulses. A tighter threshold voltage distribution is desired so that the cells in the memory block program substantially evenly.

If the $\Delta V_t$ is less than the predetermined threshold 313, the Erase $V_t$ is high enough and the erase operation has been completed 315. In this case, all of the cells have substantially the same or relatively close threshold voltages and further soft programming is not required.

In one embodiment, the erase method of FIG. 3 can be performed with either adjacent word line cells or adjacent bit line cells. In another embodiment, the method can be performed on both the adjacent word line cells and the adjacent bit line cells. In still another embodiment, the method can be performed on those cells that are in the middle of the NAND string as illustrated in FIG. 1. For example, only cells on word lines 4-27 are erased with the erase method of the present invention.

Figure 6:
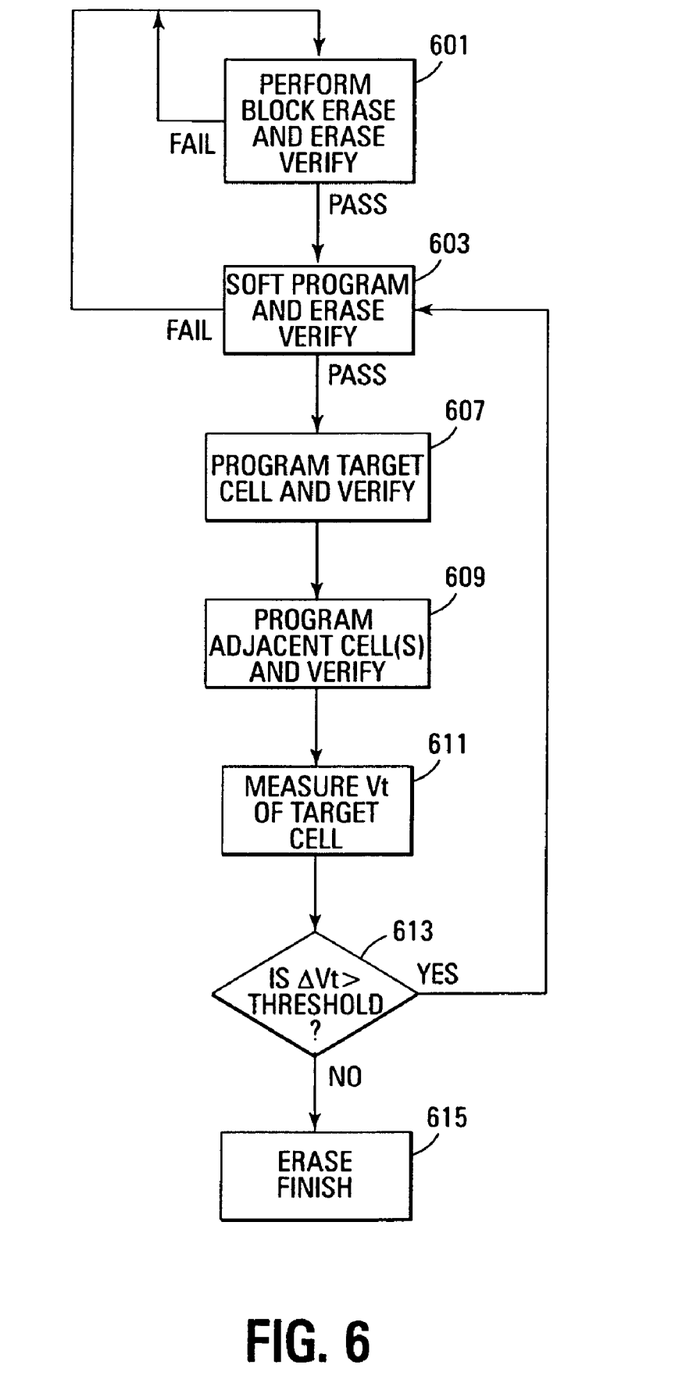
FIG. 6 shows a flow chart of another embodiment of the method for erasing a non-volatile memory device.

FIG. 6 illustrates a flow chart of another embodiment of the erase method of the present invention for erasing a memory array. The method begins with a block erase operation that includes an erase verify 601. This embodiment repeats the step of performing a block erase and verify operation 601 until the operation passes.

Once the first erase and verify operation 601 has passed, the block is then soft programmed and erase verified 603. A soft programming pulse is generated to bias the word line of the cell to be programmed in order to raise its $V_t$ from the −4.0V erased voltage to −3.0V. The soft programming may be accomplished by a shorter than normal programming pulse and/or programming pulse having a lower voltage. The cells of the block are still erased but the soft programming operation starts all of the cells of the block at a substantially uniform erased threshold voltage since the erase operation may over-erase some of the cells.

An erase verification operation 603 is performed on the erase block to verify that the cells are at the proper erase $V_t$. Any cells that are not at the proper $V_t$ are biased with another soft programming pulse until the cells in the erase block have substantially uniform threshold voltages. If the erase verify operation 603 fails, the method returns to the initial step of the block erase and verification 601. This loop is repeated until the operation passes.

In one embodiment, the verification operation biases the selected word lines with 1.0V during verification and the unselected word lines are biased at 4.5V. Alternate embodiments may use other voltage levels for both the selected and unselected word lines.

In one embodiment, the erase verification operation of the present invention can be performed with a lock-out function. The lock-out function prohibits the reading of memory cells that have been locked from access by lock bits. In one embodiment, the lock bits are stored by the memory device controller into status/control registers on the chip. These cells can be locked by the manufacturer or by the end user to protect important information.

The target memory cell is then programmed and verified 607. The target cell is programmed and verified to a predetermined threshold voltage, $V_{t1}$. The programming may be a single cell as the result of a bit programming. In another embodiment, a byte or more of data can be programmed such that the target cell as well as other cells of a page are programmed.

In one embodiment, the programming operation is comprised of generating a plurality of programming pulses that start at a predetermined voltage (e.g., 16V) and incremented by a predetermined voltage for each pulse until the cell is verified as programmed at $V_{t1}$.

The adjacent cells to the target cell are then programmed and verified 609. This operation may program each of the cells that are adjacent to the target cell such as in both the adjacent word lines and the adjacent bit lines. In an alternate embodiment, only one of the adjacent cells is programmed and verified. As described previously, this operation changes the $V_t$ of the target cell by $\Delta V_t$.

The size of $\Delta V_t$ is determined by the amount of parasitic capacitance in the array. The array structure, fabrication materials, and fabrication techniques determines the amount of parasitic capacitance.

The $V_t$ of the target cell is then measured 611. The measurement operation, in one embodiment, is accomplished by selecting the cell and the sense amplifier measuring the resulting voltage. For purposes of illustration, the new $V_t$ is referred to as $V_{t2}$.

The erase threshold voltage (i.e., $\Delta V_t$) is determined by subtracting the original $V_{t1}$ from $V_{t2}$ (i.e., $V_{t2}-V_t=\Delta V_t$). If $\Delta V_t$ is greater than or equal to a predetermined threshold 613, the Erase $V_t$ is too low and another soft programming operation 603 is required in order to raise the $V_t$ of the target cell.

In one embodiment, the predetermined threshold is 50 mV. This threshold is determined by the chip manufacturer by empirical testing of a large number of memory devices to determine what voltage level cut-off provides the best point at which additional soft programming pulses are required. The embodiments of the present invention, however, are not limited to only the threshold voltage of 50 mV. Alternate embodiments may use other predetermined threshold voltages.

Having an Erase $V_t$ that is too low can cause problems later when it desired to program the cell. The other cells in the erase block that have higher Erase $V_t$'s would require fewer program pulses to be programmed. Thus the cells with the Erase $V_t$'s that are too low might not be programmed since the programming operation may stop programming after a predetermined maximum quantity of programming pulses. A tighter threshold voltage distribution is desired so that the cells in the memory block program substantially evenly.

If the $\Delta V_t$ is less than the predetermined threshold 613, the Erase $V_t$ is high enough and the erase operation has been completed 615. In this case, all of the cells have substantially the same or relatively close threshold voltages and further soft programming is not required. If the $\Delta V_t$ is greater than or equal to the threshold 613, the soft programming and erase verify 603 are performed again.

In one embodiment, the erase method of FIG. 6 can be performed with either adjacent word line cells or adjacent bit line cells. In another embodiment, the method can be performed on both the adjacent word line cells and the adjacent bit line cells. In still another embodiment, the method can be performed on those cells that are in the middle of the NAND string as illustrated in FIG. 1. For example, only cells on word lines 4-27 are erased with the erase method of the present invention.

Figure 7:
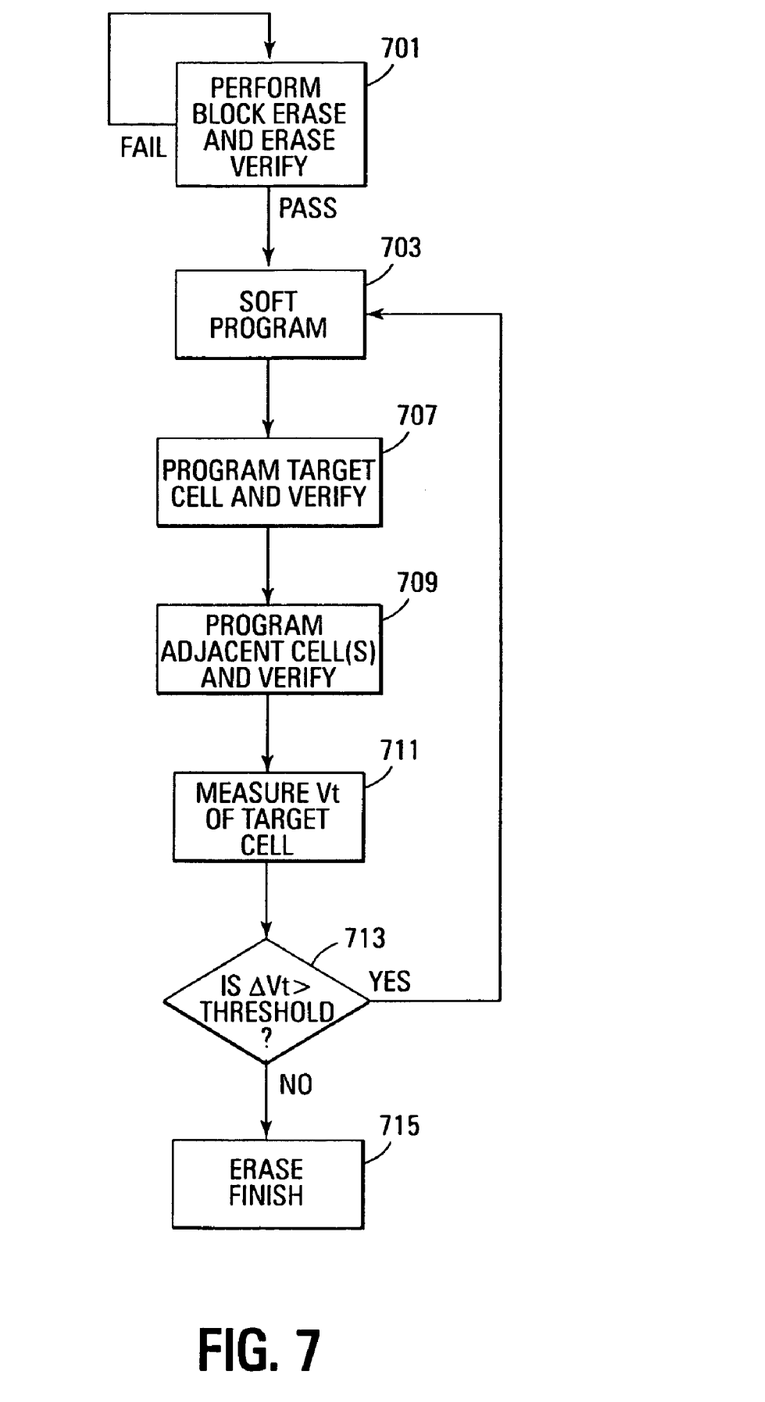
FIG. 7 shows a flow chart of yet another embodiment of the method for erasing a non-volatile memory device.

FIG. 7 illustrates a flow chart of yet another embodiment of the erase method of the present invention. This embodiment is substantially similar to the embodiments illustrated in FIGS. 3 and 6. However, this embodiment performs a block erase and erase verify 701 until the verify operation passes. Then a soft program operation without the erase verify 703 is performed.

Figure 4:
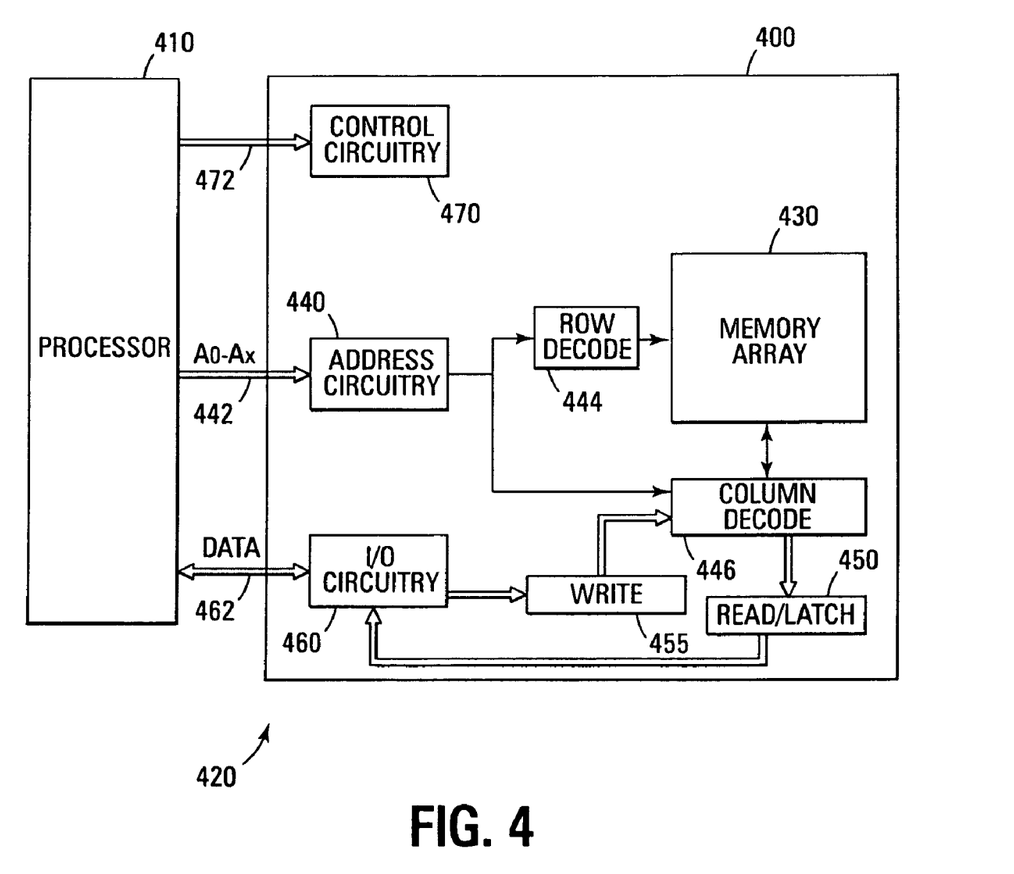
FIG. 4 shows a block diagram for one embodiment of an electronic system of the present invention.

FIG. 4 illustrates a functional block diagram of a memory device 400 that can incorporate floating gate flash memory cells. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of flash memory cells 430. The memory array 430 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture or a NOR architecture. The memory cells of the present invention can be arranged in either a NAND or NOR architecture as well as other architectures.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense amplifier/buffer circuitry 450. The sense amplifier/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write, and erase operations. The control circuitry 470 may be a state machine, a sequencer, or some other type of controller. In one embodiment, the control circuitry 470 is a state machine that performs the embodiments of the method for erasing of the present invention.

The flash memory device illustrated in FIG. 4 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 5:
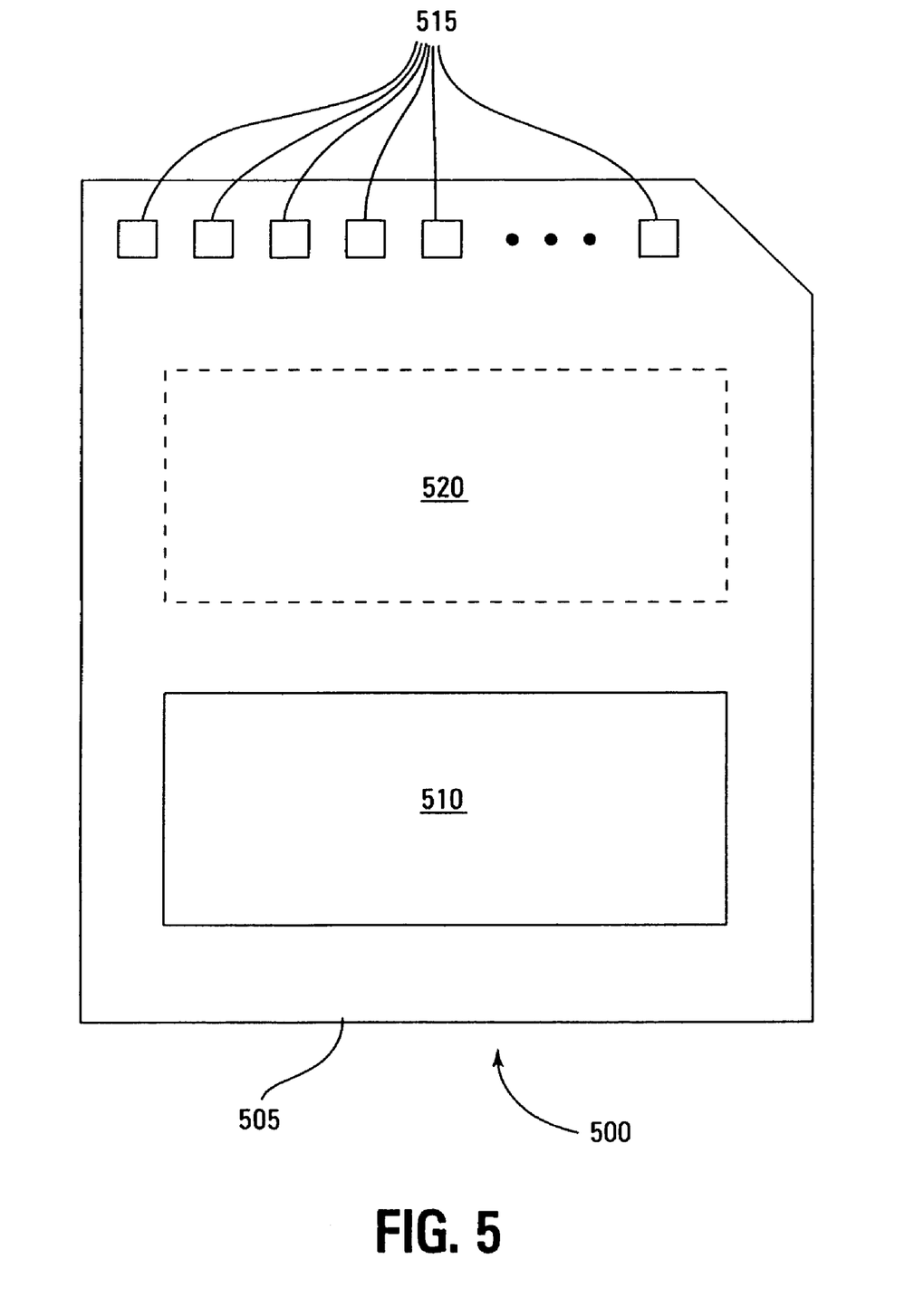
FIG. 5 shows a block diagram of a memory module of the present invention.

FIG. 5 is an illustration of a memory module 500. Although memory module 500 is illustrated as a memory card, the concepts discussed with reference to memory module 500 are applicable to other types of removable or portable memory, e.g., USB flash drives. In addition, although one example form factor is depicted in FIG. 5, these concepts are applicable to other form factors as well.

Memory module 500 includes a housing 505 to enclose one or more memory devices 510. At least one memory device 510 is comprised of floating gate memory cells of the present invention. The housing 505 includes one or more contacts 515 for communication with a host device. Examples of host devices include digital cameras, digital recording and playback devices, PDAs, personal computers, memory card readers, interface hubs and the like. For some embodiment, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on COMPACTFLASH™ memory cards licensed by SanDisk Corporation, MEMORYSTICK™ memory cards licensed by Sony Corporation, SD SECURE DIGITAL™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of I/O connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 100 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510. The additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

Figure 8:
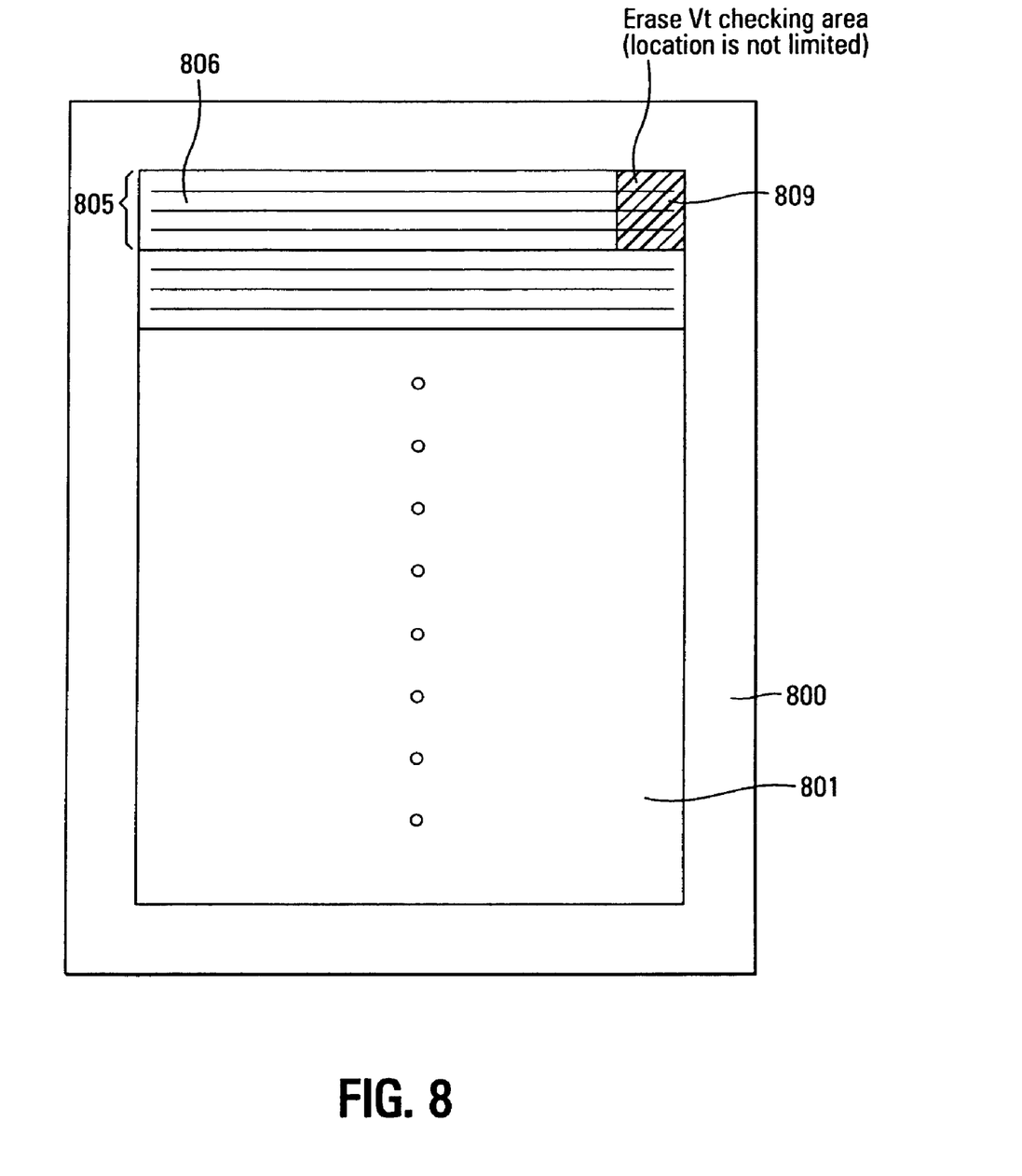
FIG. 8 shows a non-volatile memory device comprising a memory array of the present invention.

FIG. 8 illustrates a non-volatile memory device (i.e., NAND flash memory) 800 that comprises the memory array 801 of the present invention. Within the memory array 801 are a plurality of memory blocks 805. Each memory block 805 is comprised of a plurality of word lines or pages 806. One section of the memory block 805 comprises the erase $V_t$ checking area 809. This area is shown in one location for purposes of illustration. Alternate embodiments can locate this area in other locations.

CONCLUSION

In summary, embodiments of the erase method of the present invention provide for a tighter threshold voltage distribution and better control over non-volatile memory operations such as erase and read. This is accomplished by programming a target cell as well as a certain number of adjacent cells. The difference the threshold voltage of the target cell moves in response to the parasitic capacitance of the adjacent cells is determined. If this difference is greater than or equal to a predetermined threshold voltage, the target cell goes through another soft program operation until the difference is less than the predetermined threshold voltage.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erasing a non-volatile memory device comprising a plurality of cells organized in rows and columns, the method comprising:
   programming a first cell of the plurality of cells to a first threshold voltage, the first cell located in a first row and a first column;
   programming at least one adjacent cell that is adjacent to the first cell;
   measuring a second threshold voltage for the first cell;
   generating a threshold voltage difference in response to the first and second threshold voltages; and
   if the threshold voltage difference is greater than or equal to a predetermined threshold, performing a soft programming operation on the first cell.

2. The method of claim 1 wherein the at least one adjacent cell is located only in the first column.

3. The method of claim 1 wherein the at least one adjacent cell is located only in the first row.

4. The method of claim 1 wherein the at least one adjacent cell comprise a plurality of adjacent cells that are located in the first row, the first column, and adjacent rows and columns.

5. The method of claim 1 wherein the non-volatile memory device is a NAND architecture memory device.

6. The method of claim 1 wherein the predetermined threshold is 50 mV.

7. The method of claim 1 wherein the non-volatile memory device is a flash memory.

8. A method for erasing a flash memory device comprising a memory array having a plurality of cells organized in rows and columns, the method comprising:
   erasing a predetermined portion of the memory array comprising a first cell;
   programming the first cell of the plurality of cells to a first threshold voltage, the first cell located in a first row and a first column;
   programming a plurality of adjacent cells that are adjacent to the first cell;
   measuring a second threshold voltage for the first cell;
   generating a threshold voltage difference in response to the first and second threshold voltages; and
   if the threshold voltage difference is greater than or equal to a predetermined threshold, performing a soft programming operation on the first cell.

9. The method of claim 8 wherein the predetermined portion of the memory array is a memory block.

10. The method of claim 8 and further including soft programming the predetermined portion of the memory array.

11. The method of claim 10 and further including erase verifying the predetermined portion of the memory array.

12. A flash memory device comprising:
   a memory array arranged in rows and columns such that the rows comprise word lines coupled to control gates of a plurality of memory cells and the columns comprise bit lines coupled to series strings of memory cells; and
   control circuitry that is adapted to control erasing of the memory cells by programming a first cell of the plurality of cells to a first threshold voltage, the first cell located in a first word line and a first bit line, programming at least one adjacent cell that is adjacent to the first cell, measuring a second threshold voltage for the first cell, generating a threshold voltage difference in response to the first and second threshold voltages, and if the threshold voltage difference is greater than or equal to a predetermined threshold, performing a soft programming operation on the first cell.

13. The device of claim 12 wherein the flash memory device is a NAND architecture memory device.

14. The device of claim 12 and further including sense amplifiers coupled to the memory array to perform the measuring of the second threshold voltage.

15. The device of claim 12 wherein the plurality of cells are multi-level cells capable of storing a plurality of data bits.

16. An electronic system comprising:
   a processor that generates memory device control signals; and
   a memory device, coupled to the processor, that is adapted to be programmed and erased in response to the control signals, the memory device comprising:
      a memory array arranged in rows and columns such that the rows comprise word lines coupled to control gates of a plurality of memory cells and the columns comprise bit lines coupled to series strings of memory cells, the memory array further arranged in memory blocks; and
      control circuitry that is adapted to control programming of the memory cells by programming a first cell of the plurality of cells to a first threshold voltage, the first cell located in a first word line and a first bit line, programming at least one adjacent cell that is adjacent to the first cell, measuring a second threshold voltage for the first cell, generating a threshold voltage difference in response to the first and second threshold voltages, and if the threshold voltage difference is greater than or equal to a predetermined threshold, performing a soft programming operation on the first cell.

17. The system of claim 16 wherein the memory device is a NAND flash memory device.

18. The system of claim 16 wherein the control circuitry is further adapted to perform a memory block erase operation and a soft programming operation with an erase verify of the memory block.

19. A memory module comprising:
a memory array arranged in rows and columns such that the rows comprise word lines coupled to control gates of a plurality of memory cells and the columns comprise bit lines coupled to series strings of memory cells, the memory array further arranged in memory blocks; and
control circuitry that is adapted to control programming of the memory cells by programming a first cell of the plurality of cells to a first threshold voltage, the first cell located in a first word line and a first bit line, programming at least one adjacent cell that is adjacent to the first cell, measuring a second threshold voltage for the first cell, generating a threshold voltage difference in response to the first and second threshold voltages, and if the threshold voltage difference is greater than or equal to a predetermined threshold, performing a soft programming operation on the first cell; and
a plurality of contacts configured to provide selective contact between the memory array and a host system.

20. The module of claim 17 and further including a memory controller coupled to the memory array for controlling operation of the memory device in response to the host system.

21. A method for erasing a flash memory device comprising a memory array having a plurality of cells organized in rows and columns, the method comprising:
performing a block erase on a first memory block until a first verification operation determines that the first memory block is successfully erased;
performing a soft programming operation on the first memory block until a second verification operation determines that a threshold voltage of each cell in the first memory block has been raised a predetermined amount;
programming, to a first threshold voltage, a byte of cells of the first memory block;
programming a plurality of adjacent cells that are adjacent to the byte of cells;
measuring a second threshold voltage for the byte of cells;
generating a threshold voltage difference in response to the first and second threshold voltages; and
if the threshold voltage difference is greater than or equal to a predetermined threshold, performing a soft programming operation on the byte of cells until the threshold voltage difference is less than the predetermined threshold.

22. A method for erasing a flash memory device comprising a memory array having a plurality of cells organized in rows and columns, the method comprising:
performing a block erase on a first memory block until a first verification operation determines that the first memory block is successfully erased;
performing a soft programming operation on the first memory block;
programming, to a first threshold voltage, a byte of cells of the first memory block;
programming a plurality of adjacent cells that are adjacent to the byte of cells;
measuring a second threshold voltage for the byte of cells;
generating a threshold voltage difference in response to the first and second threshold voltages; and
if the threshold voltage difference is greater than or equal to a predetermined threshold, performing a soft programming operation on the byte of cells until the threshold voltage difference is less than the predetermined threshold.

* * * * *